United States Patent
Guyot et al.

(10) Patent No.: US 8,943,388 B2
(45) Date of Patent: Jan. 27, 2015

(54) TECHNIQUES FOR ENCODING AND DECODING USING A COMBINATORIAL NUMBER SYSTEM

(71) Applicant: HGST Netherlands B.V., Amsterdam (NL)

(72) Inventors: Cyril Guyot, San Jose, CA (US); Luiz Franca-Neto, Sunnyvale, CA (US); Robert Eugeniu Mateescu, San Jose, CA (US); Hessam Mahdavifar, San Diego, CA (US); Zvonimir Bandic, San Jose, CA (US); Qingbo Wang, Irvine, CA (US)

(73) Assignee: HGST Netherlands B.V., Amsterdam (NL)

( * ) Notice: Subject to any disclaimer, the term of this patent is extended or adjusted under 35 U.S.C. 154(b) by 233 days.

(21) Appl. No.: 13/712,929

(22) Filed: Dec. 12, 2012

(65) Prior Publication Data

US 2014/0164821 A1   Jun. 12, 2014

(51) Int. Cl.
    *G06F 11/00*   (2006.01)
    *G06F 11/07*   (2006.01)
(52) U.S. Cl.
    CPC ................. *G06F 11/0793* (2013.01)
    USPC .......................................................... 714/764
(58) Field of Classification Search
    CPC .................................................. G06F 11/1064
    See application file for complete search history.

(56) References Cited

U.S. PATENT DOCUMENTS

| | | | |
|---|---|---|---|
| 3,949,208 A | 4/1976 | Carter | |
| 6,327,680 B1 * | 12/2001 | Gervais et al. | 714/711 |
| 6,839,275 B2 | 1/2005 | Van Brocklin et al. | |
| 6,996,017 B2 | 2/2006 | Scheuerlein et al. | |
| 8,144,037 B2 | 3/2012 | Monro | |
| 8,205,136 B2 * | 6/2012 | Bell et al. | 714/763 |
| 2010/0277989 A1 | 11/2010 | Elfadel et al. | |
| 2010/0332895 A1 | 12/2010 | Billing et al. | |
| 2011/0080781 A1 | 4/2011 | Goux | |
| 2011/0119538 A1 | 5/2011 | Ipek et al. | |
| 2011/0296258 A1 | 12/2011 | Schechter et al. | |
| 2011/0307670 A1 | 12/2011 | Franceshini et al. | |
| 2011/0317480 A1 | 12/2011 | Lung et al. | |

OTHER PUBLICATIONS

Eric Deal, "Trends in NAND Flash Memory Error Correction," Jun. 2009, Cyclic Design, pp. 1-11.

(Continued)

*Primary Examiner* — Christopher McCarthy
(74) *Attorney, Agent, or Firm* — Steven J. Cahill

(57) ABSTRACT

A data storage system includes a memory circuit having memory cells and a control circuit. The control circuit is operable to receive data bits provided for storage in the memory cells. A subset of the memory cells have predetermined stuck-at faults. The control circuit is operable to compute a binomial coefficient for each of the predetermined stuck-at faults based on a bit position of a corresponding one of the predetermined stuck-at faults within the memory cells. The control circuit is operable to add together the binomial coefficients to generate an encoded number using a combinatorial number system. The control circuit is operable to generate a first set of redundant bits that indicate the encoded number. The first set of redundant bits are used to decode bits read from the memory cells to regenerate the data bits.

20 Claims, 5 Drawing Sheets

(56) References Cited

OTHER PUBLICATIONS

R. Micheloni, et al., "A 4Gb 2b/cell NAND Flash Memory with Embedded 5b BCH ECC for 36MB/s System Read Throughput," 2006 IEEE International Solid-State Circuits Conference, Feb. 6, 2006, Non-Volatile Memory, 7.6, pp. 1-10.

U.S. Appl. No. 13/649,072, filed Oct. 10, 2012.

H.-S. Philip Wong, et al., "Phase Change Memory," vol. 98, No. 12, Dec. 2010, Proceedings of the IEEE, pp. 2201-2227.

Nak Hee Seong, et al., "SAFER: Stuck-At-Fault Error Recovery for Memories," 2010 43rd Annual IEEE/ACM International Symposium on Microarchitecture, pp. 115-124, Dec. 8, 2010.

Stuart Schechter et al., "Use ECP, not ECC, for Hard Failures in Resistive Memories," ISCA '10 Proceedings of the 37th Annual International Symposium on Computer Architecture, Jun. 2010, pp. 141-152.

U.S. Appl. No. 13/649,007, filed Oct. 10, 2012.

Maddah et al. "Data Dependent Sparing to Manage Better-Than-Bad Blocks," Computer Science Department, University of Pittsburgh, Apr. 30, 2012.

U.S. Appl. No. 13/649,108, filed Oct. 10, 2012.

U.S. Appl. No. 13/712,956, filed Dec. 12, 2012.

"Binomial coefficient," Wikipedia, the free encyclopedia, pp. 1-19, Oct. 3, 2012.

"Combination," Wikipedia, the free encyclopedia, pp. 1-7, Sep. 28, 2012.

"Combinatorial number system," Wikipedia, the free encyclopedia, pp. 1-5, Sep. 24, 2012.

U.S. Appl. No. 13/649,098, filed Oct. 10, 2012.

\* cited by examiner

| Data Bits: | 1 | 1 | 0 | 0 | 1 | 1 | 1 | 0 | 0 | 0 | 1 | 0 | 1 | 1 | 0 | 1 | 1 | 1 | 0 | 0 | 0 | 1 | 1 | 1 | 0 |
|---|---|---|---|---|---|---|---|---|---|---|---|---|---|---|---|---|---|---|---|---|---|---|---|---|---|
| Bit Positions: | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| Memory Cells: | | | | S0 | | | S0 | | S1 | | | | | S1 | | | | S0 | | | | | | | |

FIG. 5

TECHNIQUES FOR ENCODING AND DECODING USING A COMBINATORIAL NUMBER SYSTEM

FIELD OF THE DISCLOSURE

The present disclosure relates to data storage systems, and more particularly, to techniques for encoding and decoding using a combinatorial number system.

BACKGROUND

Many data communication systems use error correction encoders and decoders to detect and correct errors in data. A data communication system may, for example, correct random errors that are generated at a rate of about $1\times10^{-4}$. To protect against an error rate of about $1\times10^{-4}$, an error correction encoder generates encoded bits having about 10% more bits than its input bits.

Phase change memory (PCM) is a class of non-volatile memory. PCM devices have many advantages over traditional non-volatile flash memory. However, PCM devices may generate a large number of errors that are induced by degradation. For example, a PCM device may generate errors at a rate of $1\times10^{-2}$ or greater.

At the limits of endurance, the error rate in non-volatile memory devices is dominated by degradation. Errors that are caused by degradation include stuck-at faults, which have different properties and statistics than the random errors that are common in data communication systems.

BRIEF SUMMARY

According to some embodiments, a data storage system includes a memory circuit having memory cells and a control circuit. The control circuit is operable to receive data bits provided for storage in the memory cells. A subset of the memory cells have predetermined stuck-at faults. The control circuit is operable to compute a binomial coefficient for each of the predetermined stuck-at faults based on a bit position of a corresponding one of the predetermined stuck-at faults within the memory cells. The control circuit is operable to add together the binomial coefficients to generate an encoded number using a combinatorial number system. The control circuit is operable to generate a first set of redundant bits that indicate the encoded number. The first set of redundant bits are used to decode bits read from the memory cells to regenerate the data bits.

Various objects, features, and advantages of the present invention will become apparent upon consideration of the following detailed description and the accompanying drawings.

BRIEF DESCRIPTION OF THE DRAWINGS

FIG. 5 illustrates examples of data bits and memory cells that can be used with the encoding and decoding techniques described herein, according to an embodiment of the present invention.

DETAILED DESCRIPTION

Figure 1:
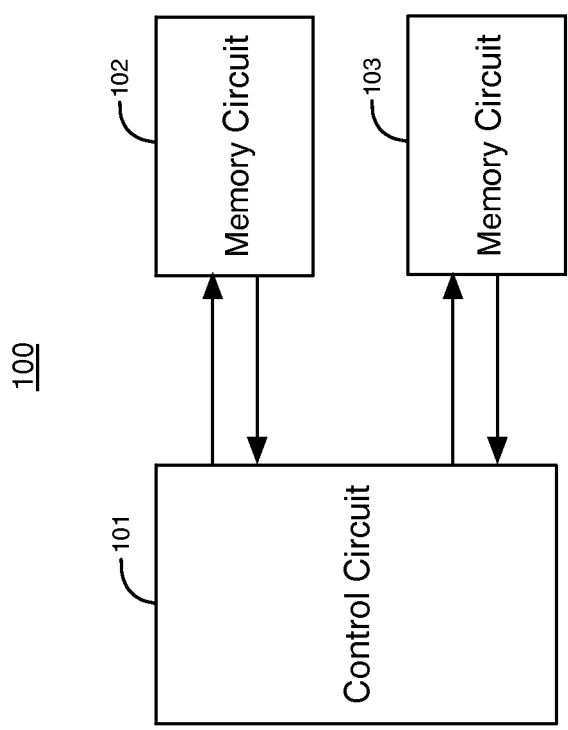
FIG. 1 illustrates an example of a data storage system, according to an embodiment of the present invention.

According to some embodiments described herein, data bits are provided for storage in memory cells of a memory circuit during a write operation. An encoder generates redundant bits for the data bits based on predetermined stuck-at faults in the memory cells. The data bits are then stored in the memory cells. After the data bits are read from the memory cells during a read operation, a decoder uses the redundant bits to correct errors in the data bits that are caused by the predetermined stuck-at faults. The memory circuit may be, for example, a phase change memory circuit (e.g., that uses chalcogenide glass) or another type of memory circuit that has stuck-at faults. Data bits as described herein may include, for example, user generated bits, bits representing software code, and any other digital values.

A memory cell having a stuck-at fault is a memory cell that can only store a single digital value. A memory cell having a stuck-at fault value of 1 can only store a logic high digital value, and a memory cell having a stuck-at fault value of 0 can only store a logic low digital value. Thus, only a logic high digital value can be read from a memory cell having a stuck-at fault value of 1 (i.e., stuck-at 1), and only a logic low digital value can be read from a memory cell having a stuck-at fault value of 0 (i.e., stuck-at 0). Memory cells having stuck-at faults generally have stuck-at fault values that are stable over time.

If some of the memory cells in the memory circuit have stuck-at faults, the digital values of the stuck-at faults and the addresses of the memory cells having the stuck-at faults are determined before the encoding process and are provided to the encoder. The encoder generates the redundant bits using the digital values and addresses of these predetermined stuck-at faults. The data bits are stored in the memory cells of the memory circuit. The redundant bits may be stored in the same memory circuit as the data bits or in a different memory circuit.

Subsequently, the data bits and the redundant bits are read from memory and provided to a decoder. The decoder corrects errors in the data bits caused by the predetermined stuck-at faults using the redundant bits. The decoder causes the data bits to be free of errors caused by the predetermined stuck-at faults in the memory cells.

The techniques described herein are directly applicable to multi-level memory cells. Multi-level memory cells can store more than one bit per memory cell. For example, if a memory cell holds 2 bits, and it becomes stuck, then the values of those two bits are fixed, and they can be treated as two separate stuck-at fault locations. Because the location of one of the stuck-at faults is known, the location of the other stuck-at fault is also known. As a result, for the same stuck-at fault error rate, less redundant bits can be generated for multi-level memory cells than the redundant bits that are generated for single-level memory cells. A single-level memory cell only stores one bit per memory cell. The number of redundant bits may be smaller, for example, by a factor equal to the number of bits per memory cell.

FIG. 1 illustrates an example of a data storage system 100, according to an embodiment of the present invention. Data storage system 100 includes a control circuit 101, a memory circuit 102, and a memory circuit 103. Control circuit 101 may be, for example, a memory controller circuit, a processor circuit, or any other type of control circuit that generates redundant bits for storage in memory circuits 102-103. Control circuit 101 may provide data bits to and receive data bits from memory circuits 102-103. The data bits are stored in one or both of memory circuits 102-103. The redundant bits may be stored in one or both of memory circuits 102-103. The data bits and redundant bits are transmitted between control circuit 101 and memory circuits 102-103 through one or more on-chip or external buses or through other types of signal lines. Control circuit 101, memory circuit 102, and memory circuit 103 may be in the same integrated circuit or in separate integrated circuits. Thus, system 100 may be a single integrated circuit device that includes circuits 101-103. Alternatively, system 100 may include three separate integrated circuit devices 101-103.

Figure 2:
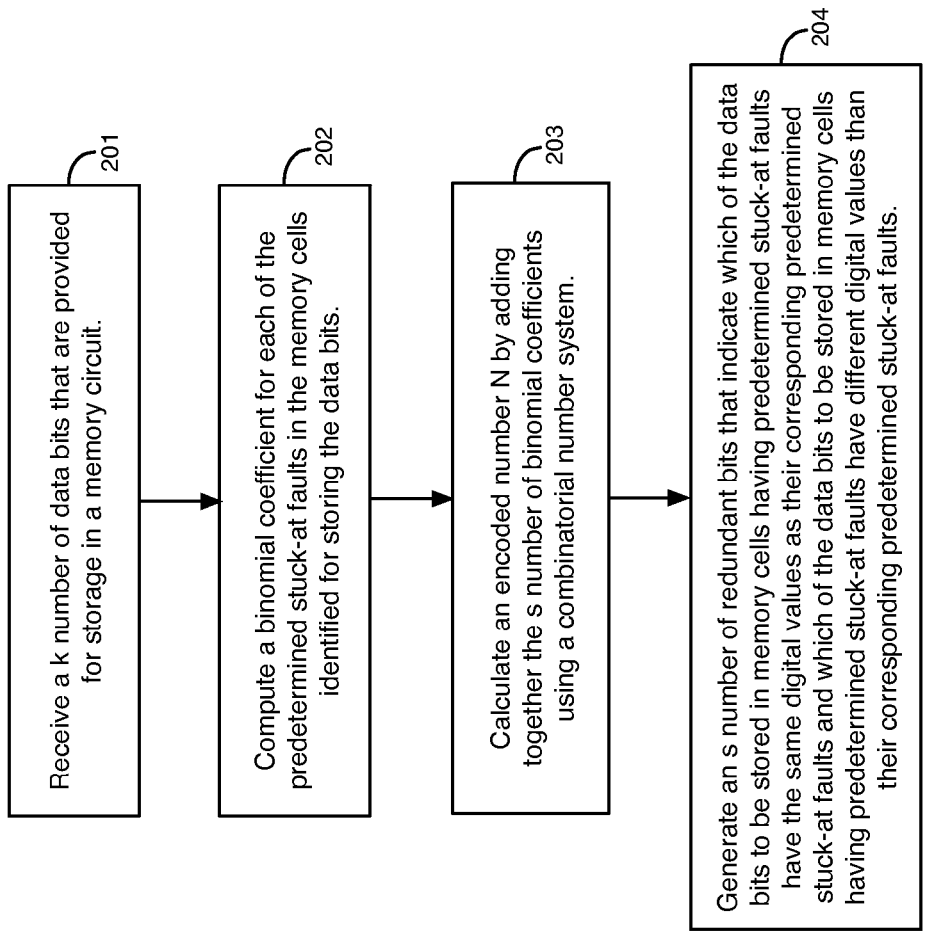
FIG. 2 is a flow chart that illustrates examples of operations for generating redundant bits for correcting errors caused by memory cells in a memory circuit having stuck-at faults, according to an embodiment of the present invention.

FIG. 2 is a flow chart that illustrates examples of operations for generating redundant bits for correcting errors caused by memory cells in a memory circuit having stuck-at faults, according to an embodiment of the present invention. Each of the memory cells in the memory circuit stores at least one digital value. One or more of the memory cells has a stuck-at fault. The addresses of the memory cells with stuck-at faults and the digital values of the stuck-at faults are determined prior to performing the operations of FIG. 2 and are provided to an encoder. For example, repeated read and write operations can be performed to determine which memory cells present errors that are consistent with stuck-at fault behavior to generate a set of predetermined stuck-at faults. The operations of FIG. 2 may, for example, be performed by an encoder (e.g., firmware) in control circuit 101.

In operation 201, the encoder receives a k number of data bits that are provided for storage in the memory circuit. k is a positive integer number. A set of memory cells in the memory circuit are identified for storing the data bits. The memory cells identified for storing the data bits are typically a subset of the total number of memory cells in the memory circuit. For example, the memory cells identified for storing the data bits may correspond to one page of memory cells in the memory circuit. Each of the data bits is provided for storage in a corresponding memory cell of the memory circuit. One or more of the data bits is provided for storage in a corresponding memory cell that has a predetermined stuck-at fault.

In operation 202, the encoder computes a binomial coefficient for each of the predetermined stuck-at faults in the memory cells identified for storing the data bits. The bit positions of the predetermined stuck-at faults in the memory cells identified for storing the data bits are referred to as $c_1, c_2, \ldots c_s$, where s is the number of predetermined stuck-at faults in the memory cells identified for storing the data bits. The bit positions $c_1, c_2, \ldots c_s$ are strictly increasing positive integers, such that $0 \le c_1 < c_2 < \ldots < c_s$.

In an embodiment in which the data bits are provided for storage in a large number of memory cells, the number s equals (or approximately equals) the number of data bits k multiplied by the bit error rate $\alpha$ of stuck-at faults in the memory cells (i.e., $s = \alpha \times k = \alpha k$). In this embodiment, if the number of predetermined stuck-at faults is less than $s = \alpha k$, then the encoder treats some of the memory cells that do not have stuck-at faults as having predetermined stuck-at faults with arbitrary stuck-at fault values, so that the total number of memory cells treated by the encoder as having predetermined stuck-at faults equals s. For single-level memory cells, the number k also equals the number of the memory cells identified for storing the data bits.

The binomial coefficient that the encoder computes for each predetermined stuck-at fault in operation 202 equals $$\binom{n}{j},$$

where n is an integer number that equals the bit position $c_1, c_2, \ldots c_s$ of the corresponding predetermined stuck-at fault within the memory cells, and j is an index that uniquely identifies the corresponding predetermined stuck-at fault. The index j is a positive integer number that varies consecutively from 1 to s to uniquely identify each of the predetermined stuck-at faults, and $j \le n$. The binomial coefficient $$\binom{n}{j}$$

equals the number of combinations of j elements that can be selected from a set of n elements. The binomial coefficient $$\binom{n}{j}$$

equals the number of j-combinations in a set having n elements, where the order of the j elements in each of the j-combinations does not matter, and there are no repetitions of more than one of the j elements in each of the j-combinations. Thus, each combination is a way that j elements can be selected from a set of n elements, disregarding order. Techniques for calculating the binomial coefficient for each predetermined stuck-at fault in the memory cells is provided by the formulas shown in equation (1) below, where $j \le n$.

$$\binom{n}{j} = \frac{n!}{j!(n-j)!} = \frac{n(n-1)(n-2)\ldots(n-(j-1))}{j(j-1)(j-2)\ldots 1} = \prod_{i=1}^{j} \frac{n-(j-1)}{i} \quad (1)$$

The encoder computes a binomial coefficient for each positive integer value of j from 1 to s using the bit position n of the corresponding predetermined stuck-at fault to generate an s number of binomial coefficients. The s number of binomial coefficients for the s number of predetermined stuck-at faults in the memory cells of the memory circuit identified for storing the data bits can be written as shown in equation (2).

$$\binom{c_1}{1}, \binom{c_2}{2}, \binom{c_3}{3} \ldots \binom{c_s}{s} \quad (2)$$

A combinatorial number system, also referred to as combinadics, for some positive integer number s is a correspondence between a set of numbers and s-combinations of the set of numbers, represented as the strictly increasing sequence of numbers $0 \le c_1 < c_2 < \ldots < c_s$. According to an embodiment, a combinatorial number system is used to indicate the bit positions of the predetermined stuck-at faults in the memory cells identified for storing the data bits. In this embodiment, the combinatorial number system is a bijective mapping of the $$\binom{k}{s}$$

number of combinations on the numerical sequence $$\left[\left[0, \binom{k}{s} - 1\right]\right],$$

where k is the number of the data bits, and s is the number of predetermined stuck-at faults in the memory cells identified for storing the data bits. All of the possible bit positions of predetermined stuck-at faults in the memory cells identified for storing the data bits can be mapped exactly using this bijective mapping.

An s-combination of a set S is a subset of S with s distinct elements. A combinatorial number system provides a representation, each by a single number, of all possible s-combinations of a set S of k elements. Choosing, for any k, {0, 1, . . . , k−1} as such a set, it can be arranged that the representation of a given s-combination C is independent of the value of k (although k must be sufficiently large). Considering C as a subset of a larger set by increasing k does not change the number that represents C.

The number N associated in the combinatorial number system of degree s to an s-combination C is the number of s-combinations strictly less than C in the given ordering. This number N can be computed from C={$c_s$, . . . , $c_2$, $c_1$} with $c_s$> . . . >$c_2$>$c_1$ as follows. From the definition of the ordering, it follows that for each s-combination S strictly less than C, there is a unique index i such that $c_i$ is absent from S, while $c_s$, . . . , $c_{i+1}$ are present in S, and no other value larger than $c_i$ is present in S. Therefore, those s-combinations S can be grouped according to the possible values 1, 2, . . . , s of i, and each group is counted separately. For a given value of i, $c_s$, . . . , $c_{i+1}$ are included in S, and the remaining i elements of S are chosen from the non-negative integers strictly less than $c_i$. Any such choice results in s-combinations S strictly less than C. The number of possible choices is $$\binom{c_i}{i},$$

which is the number of combinations in group i. The total number N of s-combinations strictly less than C then equals $$\binom{c_1}{1} + \binom{c_2}{2} + \ldots + \binom{c_s}{s}.$$

This is the index (starting from 0) of C in the ordered list of s-combinations.

In operation 203, the encoder calculates an encoded number N by adding together the s number of binomial coefficients in equation (2) using a combinatorial number system, as shown in equation (3). In equation (3), $c_1$, $c_2$, $c_3$, . . . $c_s$ are the bit positions of the s number of predetermined stuck-at faults in the memory cells identified for storing the data bits.

$$N = \binom{c_1}{1} + \binom{c_2}{2} + \binom{c_3}{3} + \ldots + \binom{c_s}{s} \quad (3)$$

Thus, the encoded number N equals the sum of the s number of binomial coefficients for the predetermined stuck-at faults in the memory cells identified for storing the data bits. In operation 203, the encoder generates a binary representation of the encoded number N as a first set of redundant bits for the data bits to be stored in the memory cells.

In operation 204, the encoder generates an s number of redundant bits that indicate which of the data bits to be stored in memory cells having predetermined stuck-at faults have the same digital values as their corresponding predetermined stuck-at faults and which of the data bits to be stored in memory cells having predetermined stuck-at faults have different digital values than their corresponding predetermined stuck-at faults. As an example, the s number of redundant bits generated in operation 204 may have a 0 in their $i^{th}$ bit position if the $i^{th}$ stuck-at fault matches the digital value of the data bit to be stored in that memory cell and a 1 in their $i^{th}$ bit position if the $i^{th}$ stuck-at fault does not match the digital value of the data bit to be stored in that memory cell.

In the embodiment of FIG. 2, the encoder generates one set of redundant bits that indicate the encoded number N calculated from equation (3) and another set of redundant bits that indicate which of the data bits to be stored in memory cells having predetermined stuck-at faults match the digital values of corresponding ones of those stuck-at faults. Equation (4) below indicates the number of redundant bits R that the encoder generates in operations 203-204, where s=αk. Equations (5) and (6) below indicate the maximum number of redundant bits R that the encoder generates in operations 203-204.

$$R = \alpha k + \log_2\left(\sum_{i=0}^{\alpha k} \binom{k}{i}\right) \quad (4)$$

$$R \leq \alpha k + H(\alpha)k \approx k(\alpha - \alpha\log_2(\alpha) - (1-\alpha)\log_2(1-\alpha)) \quad (5)$$

$$R \leq s + s\log_2(\alpha^{-1}) + \frac{s}{\ln(2)} \leq \left(1 + \frac{1}{\ln(2)}\right)s + s\log_2(\alpha^{-1}) \quad (6)$$

The data bits are stored in the memory cells identified for storing the data bits. The data bits are stored in the memory cells during a write operation before, during or after the operations of FIG. 2. The redundant bits are stored in memory and associated with the data bits. The redundant bits may be stored in the same memory circuit as the data bits or in a different memory circuit. During a read operation that accesses the data bits from the memory cells, the redundant bits are read from memory and used to correct errors in the data bits that are caused by the predetermined stuck-at faults in the memory cells.

Figure 3:
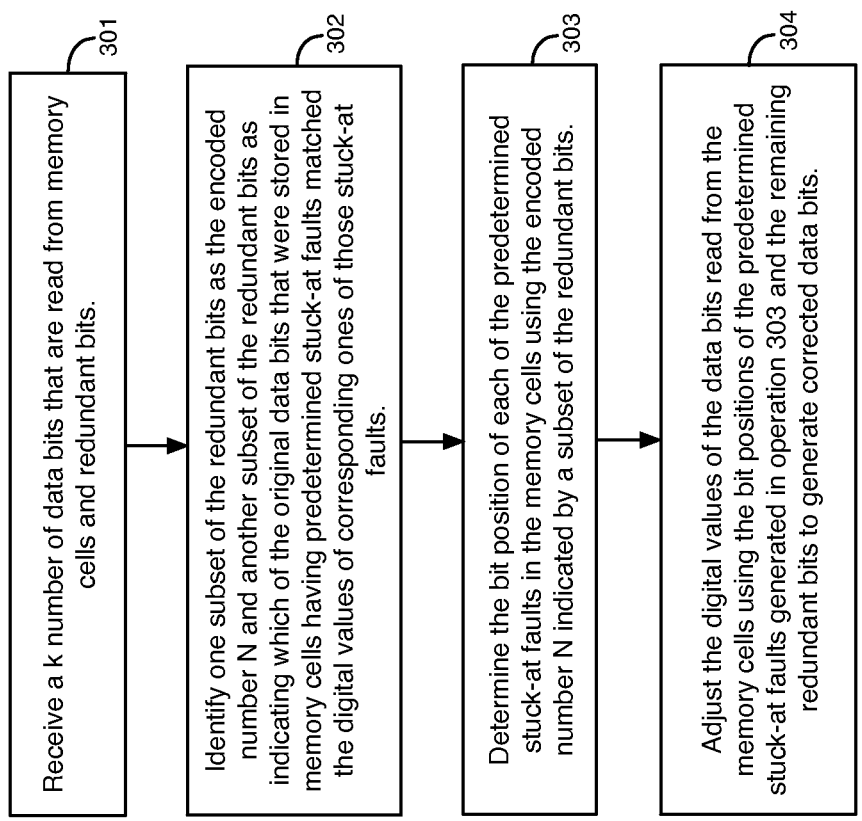
FIG. 3 is a flow chart that illustrates examples of operations for using redundant bits to correct errors in data bits that are caused by stuck-at faults in memory cells of a memory circuit, according to an embodiment of the present invention.

FIG. 3 is a flow chart that illustrates examples of operations for using redundant bits to correct errors in data bits that are caused by stuck-at faults in memory cells of a memory circuit, according to an embodiment of the present invention. The data bits are read from the memory cells of the memory circuit during a read operation and provided to a decoder. Redundant bits that are associated with the data bits are read from memory and provided to the decoder. The redundant bits are generated by the encoder using the operations of FIG. 2 and are associated with the data bits. The decoder corrects errors in the data bits that are caused by the predetermined stuck-at faults in the memory cells using the redundant bits associated with the data bits.

In operation 301, the decoder receives a k number of data bits that are read from the memory cells during a read operation. The decoder also receives redundant bits during the read operation. The redundant bits are read from the same memory circuit as the data bits or from a different memory circuit.

In operation 302, the decoder identifies one subset of the redundant bits as the encoded number N and another subset of the redundant bits as indicating which of the original data bits that were stored in memory cells having predetermined stuck-at faults matched the digital values of corresponding ones of those stuck-at faults. As an example, the encoder may cause the first s number of the redundant bits to indicate which of the original data bits that were stored in memory cells having predetermined stuck-at faults matched the digital values of corresponding ones of those stuck-at faults and the remaining redundant bits to indicate the encoded number N. In this example, the decoder uses the first s number of the redundant bits to indicate which of the original data bits that were stored in memory cells having predetermined stuck-at faults matched the digital values of corresponding ones of those stuck-at faults and the remaining redundant bits as the binary value of the encoded number N. In this example, the decoder receives or stores the bit error rate $\alpha$, and calculates s using the equation s=$\alpha$k.

In operation 303, the decoder determines the bit position of each of the predetermined stuck-at faults in the memory cells using the encoded number N indicated by a subset of the redundant bits. N equals the sum of the s number of binomial coefficients for the predetermined stuck-at faults in the memory cells that stored the data bits, as described above and shown in equation (3). The decoder may, for example, determine the bit positions of the predetermined stuck-at faults using the encoded number N as described below with respect to FIG. 4.

In operation 304, the decoder adjusts the digital values of the data bits read from the memory cells using the bit positions of the predetermined stuck-at faults generated in operation 303 and the remaining redundant bits to generate corrected data bits. The remaining redundant bits indicate which of the original data bits that were stored in memory cells having predetermined stuck-at faults matched the digital values of corresponding ones of those stuck-at faults. The decoder may adjust the digital values of one or more of the data bits that were read from the memory cells having the predetermined stuck-at faults based on the digital values of the remaining redundant bits.

As an example, the remaining redundant bits have a 0 in their $i^{th}$ bit position if the $i^{th}$ predetermined stuck-at fault matches the digital value of the original data bit that was stored in that memory cell and a 1 in their $i^{th}$ bit position if the $i^{th}$ predetermined stuck-at fault does not match the digital value of the original data bit that was stored in that memory cell. The decoder determines which of the data bits were read from memory cells having predetermined stuck-at faults based on the result of operation 303. The decoder inverts each of the data bits read from a memory cell having a predetermined stuck-at fault if a corresponding one of the remaining redundant bits indicates that the original data bit stored in that memory cell did not match the digital value of the stuck-at fault of that memory cell to generate a corresponding one of the corrected data bits. The decoder does not invert the remaining data bits read from the memory cells to generate corresponding ones of the corrected data bits.

Figure 4:
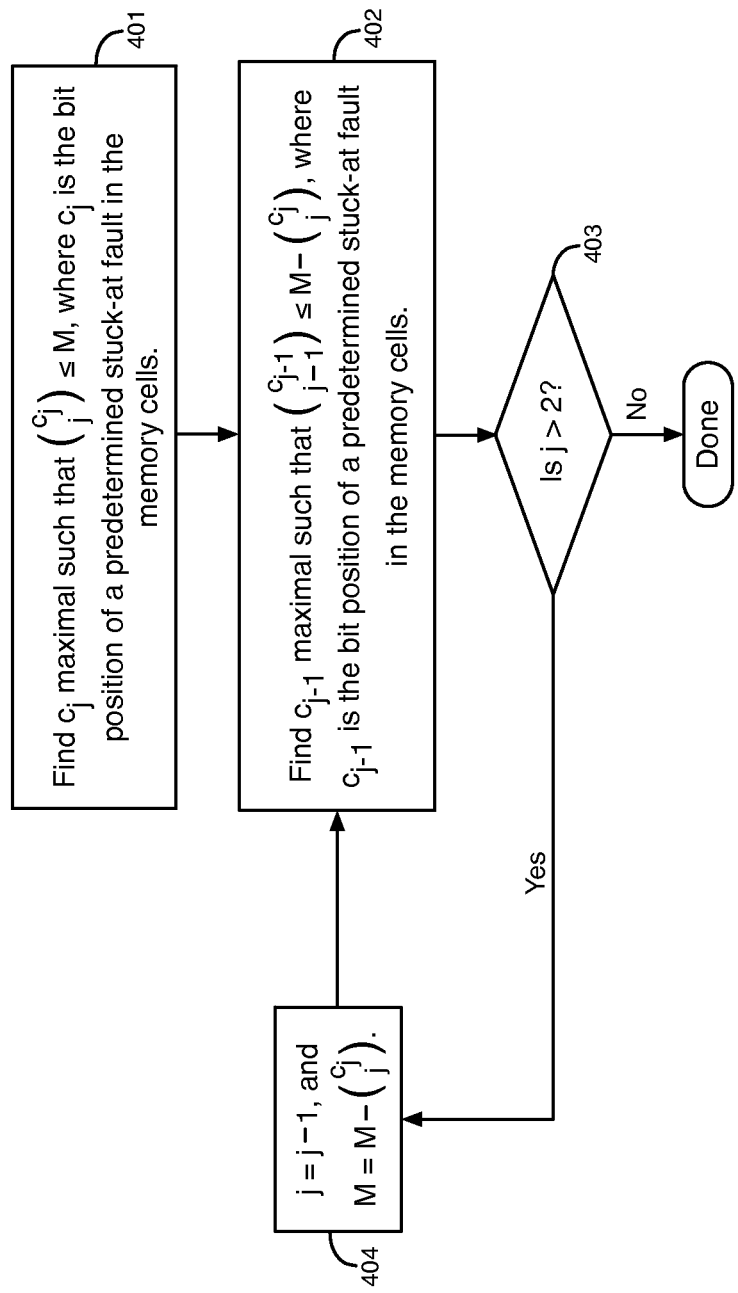
FIG. 4 is a flow chart that illustrates examples of operations used by a decoder to determine the bit positions of predetermined stuck-at faults in the memory cells using the encoded number indicated by a subset of the redundant bits, according to an embodiment of the present invention.

FIG. 4 is a flow chart that illustrates examples of operations used by a decoder to determine the bit positions of predetermined stuck-at faults in memory cells using the encoded number N indicated by a subset of redundant bits, according to an embodiment of the present invention. In the embodiment of FIG. 4, j is a variable index that equals a positive integer number, and M is a variable parameter that equals a positive integer number. In operation 401, index j equals the number of stuck-at faults s, and parameter M equals the encoded number N indicated by the subset of the redundant bits identified in operation 302. The decoder locates the j-combination corresponding to the encoded number N. The smallest combination with $c_j$ as its largest element is $$\binom{c_j}{j}.$$

Therefore, $c_j$ is the largest positive integer number such that $$\binom{c_j}{j} \leq M.$$

In operation 401, given an integer $$0 \leq N \leq \binom{k}{s},$$

the decoder finds $c_j$ maximal such that $$\binom{c_j}{j} \leq M,$$

where M equals the encoded number N in the combinatorial number system. The decoder selects the value $c_j$ as the bit position of a first predetermined stuck-at fault in the memory cells.

If j>1, the remaining elements of the j-combination form the j−1 combination corresponding to the number $$N - \binom{c_j}{j}$$

in the combinatorial number system of degree j−1. The decoder finds the remaining elements of the j-combination by repeating the same operations using $$M - \binom{c_j}{j}$$

and j−1, instead of M and j, respectively. Specifically, in operation 402, the decoder finds $c_{j-1}$ maximal such that $$\binom{c_{j-1}}{j-1} \leq M - \binom{c_j}{j}.$$

In the first iteration of operation 402, index j equals s, and parameter M equals the encoded number N. The decoder selects the value $c_{j-1}$ as the bit position of a second predetermined stuck-at fault in the memory cells.

The decoder then determines if j>2 in decision operation 403. If j=2 at operation 403, the decoding process terminates. If j>2 at operation 403, then the decoder subtracts 1 from j in operation 404 (i.e., j=j−1) to generate a new value of index j for the next iteration of operations 402-404. The decoder decrements the value of j by 1 in each iteration of operation 404. Also, in operation 404, the decoder subtracts $$\binom{c_j}{j}$$

from M to generate a new value of parameter M for the next iteration of operations 402-404

$$\left(\text{i.e., } M = M - \binom{c_j}{j}\right).$$

The decoder then repeats operations 402-403 using the new values of j and M calculated in operation 404 to determine the bit position of the next predetermined stuck-at fault in the memory cells. The decoder continues to perform iterations of operations 402-404 to determine each of the bit positions $c_1$, $c_2$, ..., $c_{s-1}$, $c_s$ of the s number of predetermined stuck-at faults in the memory cells where the data bits were read from.

FIG. 5 illustrates examples of data bits and memory cells that can be used with the encoding and decoding techniques described herein, according to an embodiment of the present invention. The values shown in and described with respect to FIG. 5 are merely examples that are provided for the purpose of illustration and are not intended to be limiting.

FIG. 5 illustrates 25 single-level memory cells in a memory circuit at bit positions 0-24. The 25 memory cells are shown as boxes in FIG. 5 for ease of illustration. FIG. 5 also illustrates an exemplary set of 25 data bits in bit positions 0-24. The 25 data bits shown in FIG. 5 are provided for storage in the 25 memory cells. Each of the data bits is provided for storage in a corresponding memory cell having the same bit position as that data bit. For example, the leftmost data bit shown in FIG. 5 at bit position 0 is provided for storage in the corresponding leftmost memory cell shown in FIG. 5 at bit position 0.

Some of the memory cells shown in FIG. 5 have stuck-at faults. The memory cells having stuck-at 0 faults are identified by S0 in FIG. 5. The memory cells at bit positions 3, 6, and 17 have stuck-at 0 faults. The memory cells having stuck-at 1 faults are identified by S1 in FIG. 5. The memory cells at bit positions 8 and 13 have stuck-at 1 faults.

In operation 202, the encoder computes a binomial coefficient for each of the stuck-at faults at bit positions 3, 6, 8, 13, and 17 in the memory cells shown in FIG. 5. The 5 binomial coefficients for the 5 stuck-at faults in the memory cells of FIG. 5 are $$\binom{3}{1}, \binom{6}{2}, \binom{8}{3}, \binom{13}{4}, \text{ and } \binom{17}{5},$$

which equal the numbers 3, 15, 56, 715, and 6188, respectively.

In operation 203, the encoder calculates an encoded number N that corresponds to the bit positions 3, 6, 8, 13, and 17 of the 5 stuck-at faults in the memory cells by adding together the 5 binomial coefficients calculated in operation 202. The encoded number N equals 6977 in this example. The encoder then generates a set of redundant bits that indicate the binary value of 6977.

In operation 204, the encoder generates a set of 5 redundant bits that indicate which of the data bits to be stored in memory cells having stuck-at faults have the same digital values as their corresponding stuck-at faults and which of the data bits to be stored in memory cells having stuck-at faults have different digital values than their corresponding stuck-at faults. In operation 204, the encoder determines that the data bits at bit positions 3 and 13 have the same digital values as their corresponding stuck-at faults and the data bits at bit positions 6, 8, and 17 have different digital values than their corresponding stuck-at faults.

The encoder generates a set of 5 redundant bits equal to 01101. Each 0 in the $i^{th}$ bit position of this set of redundant bits indicates that the $i^{th}$ stuck-at fault matches the digital value of the data bit to be stored in that memory cell. Each 1 in the $i^{th}$ bit position of this set of redundant bits indicates that the $i^{th}$ stuck-at fault does not match the digital value of the data bit to be stored in that memory cell. The redundant bits 01101 correspond to the stuck-at faults of the memory cells shown in FIG. 5 at bit positions 3, 6, 8, 13, and 17, respectively.

After the data bits are read from the memory cells during a read operation, the data bits and redundant bits are provided to a decoder. In operation 302, the decoder identifies one subset of the redundant bits as indicating the encoded number N. The decoder also identifies another subset of the redundant bits as indicating which of the original data bits were stored in memory cells having stuck-at faults that matched the digital values of corresponding ones of those stuck-at faults.

In operation 303, the decoder decodes the encoded number N using the operations of FIG. 4. Initially, index j equals 5 in this example. In operation 401, the decoder determines the maximum value of $c_5$ such that $$\binom{c_5}{5} \leq 6977.$$

Thus, the decoder determines that $c_5$ equals 17. In operation 402, the decoder determines the maximum value of $c_4$ such that $$\binom{c_4}{4} \leq 6977 - \binom{c_5}{5} = 789.$$

Thus, the decoder determines that $c_4$ equals 13.

After decrementing the value of j by 1 in the first iteration of operation 404 causing j to equal 4, the decoder determines the maximum value of $c_3$ such that $$\binom{c_3}{3} \leq 789 - \binom{c_4}{4} = 74$$

in the second iteration of operation 402. Thus, the decoder determines that $c_3$ equals 8. After decrementing the value of j by 1 in the second iteration of operation 404 causing j to equal 3, the decoder determines the maximum value of $c_2$ such that $$\binom{c_2}{2} \le 74 - \binom{c_3}{3} = 18$$

in the third iteration of operation 402. Thus, the decoder determines that $c_2$ equals 6. After decrementing the value of j by 1 in the third iteration of operation 404 causing j to equal 2, the decoder determines the maximum value of $c_1$ such that $$\binom{c_1}{1} \le 18 - \binom{c_2}{2} = 3$$

in the fourth iteration of operation 402. Thus, the decoder determines that $c_1$ equals 3. Index j equals 2 in the next iteration of operation 403, and the decoding process then terminates. The decoder determines that the bit positions of the stuck-at faults $c_5$, $c_4$, $c_3$, $c_2$, and $c_1$ are 17, 13, 8, 6, and 3, respectively.

Embodiments of the present invention can, for example, be implemented using one or a combination of hardware, software, and a computer-readable medium containing program instructions. Embodiments of the present invention can be embodied as program code stored on a non-transitory computer readable medium that can be run on a computer. Software implemented by embodiments of the present invention and results of the present invention can be stored on a computer-readable medium such as semiconductor memory, phase change memory, hard disk drive, compact disc (CD), digital video disc (DVD), or other media. Results of the present invention can be used for various purposes such as being executed or processed by a processor, being displayed to a user, transmitted in a signal over a network, etc. Embodiments of the present invention may also be embodied as a computer readable program code unit stored on a non-transitory computer readable medium, for causing a number of computer systems connected via a network to affect distributed processing.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A data storage system comprising:
a memory circuit comprising memory cells; and
a control circuit operable to receive data bits provided for storage in the memory cells, a subset of the memory cells having predetermined stuck-at faults,
wherein the control circuit is operable to compute a binomial coefficient for each of the predetermined stuck-at faults based on a bit position of a corresponding one of the predetermined stuck-at faults within the memory cells, wherein the control circuit is operable to add together the binomial coefficients to generate an encoded number using a combinatorial number system, wherein the control circuit is operable to generate a first set of redundant bits that indicate the encoded number, and wherein the first set of redundant bits are used to decode bits read from the memory cells to regenerate the data bits.

2. The data storage system of claim 1, wherein the control circuit is operable to generate a second set of redundant bits indicating which of the data bits match digital values of their corresponding predetermined stuck-at faults and which of the data bits have different digital values than their corresponding predetermined stuck-at faults.

3. The data storage system of claim 2, wherein the data storage system is operable to associate the first and the second sets of redundant bits with the data bits, and wherein the data storage system is operable to decode the bits read from the memory cells using the first and the second sets of redundant bits to regenerate the data bits.

4. The data storage system of claim 1, wherein the memory circuit is a phase change memory circuit.

5. The data storage system of claim 1, wherein the control circuit is operable to cause each of the binomial coefficients to equal a number of combinations of j elements that are selectable from a set of n elements, wherein n is an integer number that equals the bit position of the corresponding one of the predetermined stuck-at faults within the memory cells, and wherein j is an index that uniquely identifies the corresponding one of the predetermined stuck-at faults.

6. A data storage system comprising:
a memory circuit comprising memory cells; and
a control circuit operable to receive data bits read from the memory cells, wherein the control circuit is operable to receive redundant bits associated with the data bits,
wherein the control circuit is operable to identify an encoded number indicated by a first subset of the redundant bits, wherein the control circuit is operable to determine bit positions of a set of stuck-at faults in the memory cells based on combinations that are computed using the encoded number in a combinatorial number system, and wherein the control circuit is operable to adjust digital values of the data bits using the bit positions of the set of stuck-at faults and a second subset of the redundant bits to generate corrected data bits.

7. The data storage system of claim 6, wherein the second subset of the redundant bits indicates which of a set of bits that were provided for storage in the memory cells having the set of stuck-at faults matched digital values of corresponding ones of the stuck-at faults.

8. The data storage system of claim 7, wherein the control circuit is operable to determine a bit position of a first one of the stuck-at faults based on a first combination of j elements selectable from a set of $c_j$ elements, wherein $c_j$ has a maximum value such that the first combination is less than or equal to the encoded number, wherein j equals a number of the data bits times a bit error rate of the stuck-at faults in the memory cells, and wherein $c_j$ equals the bit position of the first one of the stuck-at faults.

9. The data storage system of claim 8, wherein the control circuit is operable to determine a bit position of a second one of the stuck-at faults based on a second combination of j−1 elements selectable from a set of $c_{j-1}$ elements, wherein $c_{j-1}$ has a maximum value such that the second combination is less than or equal to the encoded number minus the first combination, and wherein $c_{j-1}$ equals the bit position of the second one of the stuck-at faults.

10. The data storage system of claim 9, wherein the control circuit is operable to determine a bit position of a third one of the stuck-at faults based on a third combination of j−2 elements selectable from a set of $c_{j-2}$ elements, wherein $c_{j-2}$ has a maximum value such that the third combination is less than or equal to the encoded number minus the first combination minus the second combination, and wherein $c_{j-2}$ equals the bit position of the third one of the stuck-at faults.

11. A method comprising:
receiving data bits at a control circuit that are provided for storage in memory cells of a memory circuit, a subset of the memory cells having predetermined stuck-at faults;
computing a binomial coefficient for each of the predetermined stuck-at faults based on a bit position of a corresponding one of the predetermined stuck-at faults within the memory cells using the control circuit;
adding together the binomial coefficients computed for the predetermined stuck-at faults using the control circuit to generate an encoded number in a combinatorial number system; and
generating a first set of redundant bits that indicate the encoded number using the control circuit, wherein the first set of redundant bits are used to decode bits read from the memory cells to regenerate the data bits.

12. The method of claim 11, further comprising:
generating a second set of redundant bits indicating which of the data bits match digital values of their corresponding predetermined stuck-at faults and which of the data bits have different digital values than their corresponding predetermined stuck-at faults.

13. The method of claim 12, further comprising:
associating the first and the second sets of redundant bits with the data bits; and
decoding the bits read from the memory cells using the first and the second sets of redundant bits to regenerate the data bits.

14. The method of claim 11, wherein the memory circuit is a phase change memory circuit.

15. The method of claim 11, wherein computing a binomial coefficient for each of the predetermined stuck-at faults based on a bit position of a corresponding one of the predetermined stuck-at faults within the memory cells using the control circuit further comprises causing each of the binomial coefficients to equal a number of combinations of j elements that are selectable from a set of n elements, wherein n is an integer number that equals the bit position of the corresponding one of the predetermined stuck-at faults within the memory cells, and wherein j is an index that uniquely identifies the corresponding one of the predetermined stuck-at faults.

16. A method comprising:
receiving data bits at a control circuit that are read from memory cells of a memory circuit;
receiving redundant bits associated with the data bits at the control circuit;
identifying an encoded number indicated by a first subset of the redundant bits using the control circuit;
determining bit positions of a set of stuck-at faults in the memory cells using combinations that are computed by the control circuit based on the encoded number in a combinatorial number system; and
adjusting digital values of the data bits using the bit positions of the set of stuck-at faults and a second subset of the redundant bits to generate corrected data bits.

17. The method of claim 16, wherein the second subset of the redundant bits indicates which of a set of bits that were provided for storage in the memory cells having the set of stuck-at faults matched digital values of corresponding ones of the stuck-at faults.

18. The method of claim 17, wherein determining bit positions of a set of stuck-at faults in the memory cells using combinations that are computed by the control circuit based on the encoded number in a combinatorial number system further comprises:
determining a bit position of a first one of the stuck-at faults based on a first combination of j elements selectable from a set of $c_j$ elements, wherein $c_j$ has a maximum value such that the first combination is less than or equal to the encoded number, wherein j equals a number of the data bits times a bit error rate of the stuck-at faults in the memory cells, and wherein $c_j$ equals the bit position of the first one of the stuck-at faults.

19. The method of claim 18, wherein determining bit positions of a set of stuck-at faults in the memory cells using combinations that are computed by the control circuit based on the encoded number in a combinatorial number system further comprises:
determining a bit position of a second one of the stuck-at faults based on a second combination of j−1 elements selectable from a set of $c_{j-1}$ elements, wherein $c_{j-1}$ has a maximum value such that the second combination is less than or equal to the encoded number minus the first combination, and wherein $c_{j-1}$ equals the bit position of the second one of the stuck-at faults.

20. The method of claim 19, wherein determining bit positions of a set of stuck-at faults in the memory cells using combinations that are computed by the control circuit based on the encoded number in a combinatorial number system further comprises:
determining a bit position of a third one of the stuck-at faults based on a third combination of j−2 elements selectable from a set of $c_{j-2}$ elements, wherein $c_{j-2}$ has a maximum value such that the third combination is less than or equal to the encoded number minus the first combination minus the second combination, and wherein $c_{j-2}$ equals the bit position of the third one of the stuck-at faults.

* * * * *